US012615983B2

(12) United States Patent
Levtchin et al.

(10) Patent No.: US 12,615,983 B2
(45) Date of Patent: Apr. 28, 2026

(54) METHODS FOR WET ATOMIC LAYER ETCHING OF SILICON DIOXIDE

(71) Applicant: Tokyo Electron Limited, Tokyo (JP)

(72) Inventors: Beronika Levtchin, Chaska, MN (US); Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 246 days.

(21) Appl. No.: 18/602,858

(22) Filed: Mar. 12, 2024

(65) Prior Publication Data

US 2025/0293039 A1 Sep. 18, 2025

(51) Int. Cl.
*H01L 21/311* (2006.01)

(52) U.S. Cl.
CPC ............................... *H01L 21/31111* (2013.01)

(58) Field of Classification Search
None
See application file for complete search history.

(56) References Cited

U.S. PATENT DOCUMENTS

| | | | |
|---|---|---|---|
| 4,180,432 A | 12/1979 | Clark | |
| 8,043,972 B1 | 10/2011 | Liu et al. | |
| 8,465,662 B2 * | 6/2013 | Lim ................... | H01L 21/31111 |
| | | | 252/79.3 |
| 9,425,041 B2 | 8/2016 | Berry, III et al. | |
| 10,163,623 B1 * | 12/2018 | Kelly ................. | H10D 84/0193 |
| 12,027,375 B2 * | 7/2024 | Peter ................... | H01L 21/0335 |
| 12,506,011 B2 * | 12/2025 | Abel ................. | H01L 21/31111 |
| 2019/0348296 A1 * | 11/2019 | Sherpa .............. | H01L 21/31116 |
| 2021/0407811 A1 * | 12/2021 | Qin ..................... | H01L 21/3065 |
| 2022/0122848 A1 | 4/2022 | Peter et al. | |
| 2022/0139720 A1 | 5/2022 | Woods et al. | |
| 2023/0117790 A1 | 4/2023 | Abel | |
| 2023/0274944 A1 | 8/2023 | Suzuki et al. | |
| 2025/0079180 A1 * | 3/2025 | Dahal .............. | H01L 21/32134 |

FOREIGN PATENT DOCUMENTS

WO 2017099718 6/2017

OTHER PUBLICATIONS

MicroChemicals, "Wet-Chemical Etching of Silicon and Sio2", Basic of Microstructuring, Obtained from Internet Feb. 8, 2024, 7 pgs.
Notification of Transmittal of The International Search Report and The Written Opinion of The International Searching Authority, or The Declaration, Filing Date Jan. 15, 2025, PCT/US2025/011696; May 9, 2025; 8 pgs.

* cited by examiner

*Primary Examiner* — Shamim Ahmed
(74) *Attorney, Agent, or Firm* — Egan, Enders & Huston LLP.

(57) ABSTRACT

The present disclosure provides a new wet atomic layer etch (ALE) process for etching silicon dioxide ($SiO_2$) materials. More specifically, the present disclosure provides various embodiments of methods that utilize new etch chemistries for etching a $SiO_2$ layer in a cyclic wet ALE process. The new etch chemistries disclosed herein use an anhydrous basic surface modification solution to create self-limiting reactions on exposed surfaces of the $SiO_2$ layer and form a silicate passivation layer, which is insoluble in the surface modification solution, but readily soluble in a dissolution solution.

22 Claims, 10 Drawing Sheets

*FIG. 1*

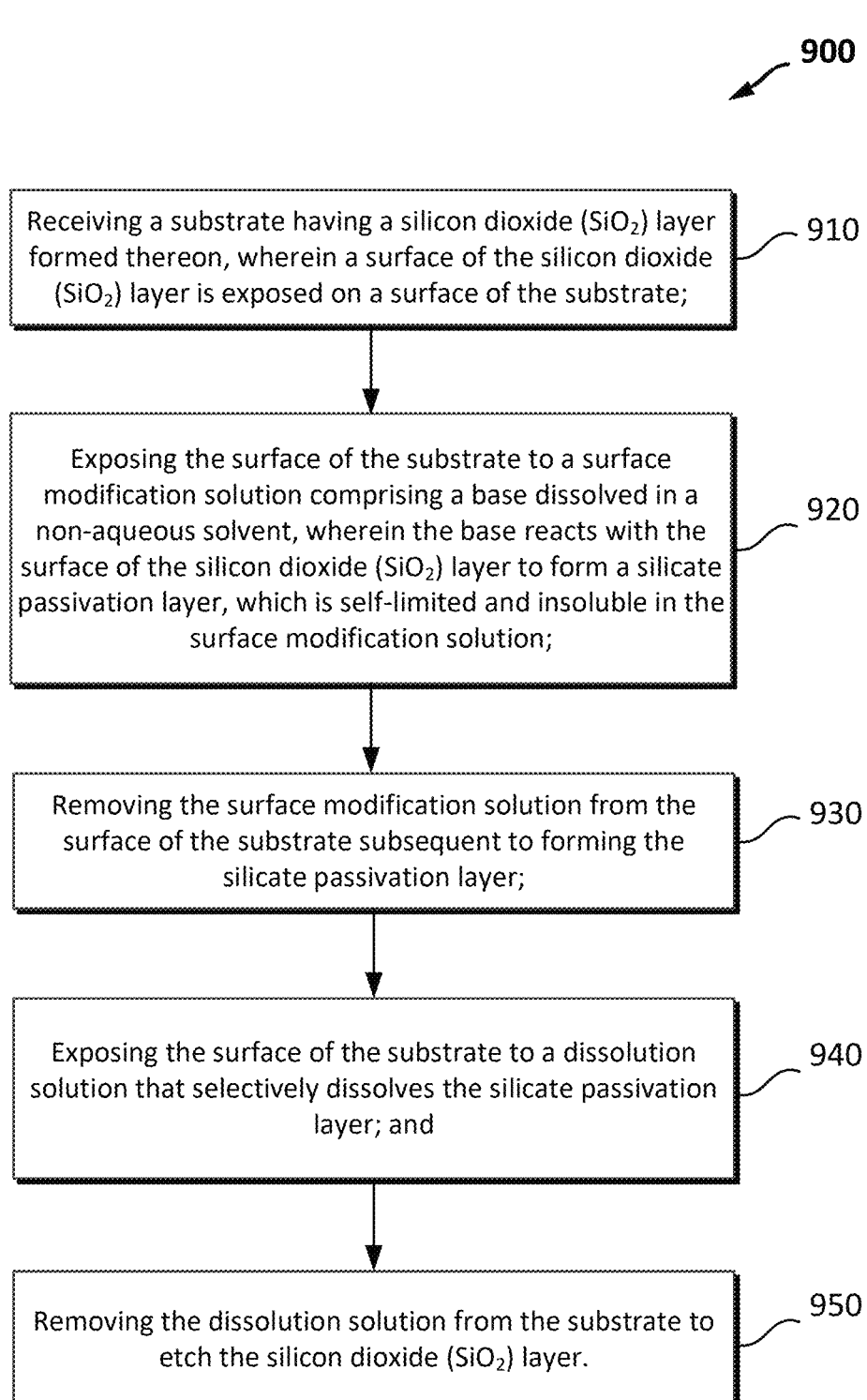

_900_

Receiving a substrate having a silicon dioxide ($SiO_2$) layer formed thereon, wherein a surface of the silicon dioxide ($SiO_2$) layer is exposed on a surface of the substrate; — 910

Exposing the surface of the substrate to a surface modification solution comprising a base dissolved in a non-aqueous solvent, wherein the base reacts with the surface of the silicon dioxide ($SiO_2$) layer to form a silicate passivation layer, which is self-limited and insoluble in the surface modification solution; — 920

Removing the surface modification solution from the surface of the substrate subsequent to forming the silicate passivation layer; — 930

Exposing the surface of the substrate to a dissolution solution that selectively dissolves the silicate passivation layer; and — 940

Removing the dissolution solution from the substrate to etch the silicon dioxide ($SiO_2$) layer. — 950

_FIG. 9_

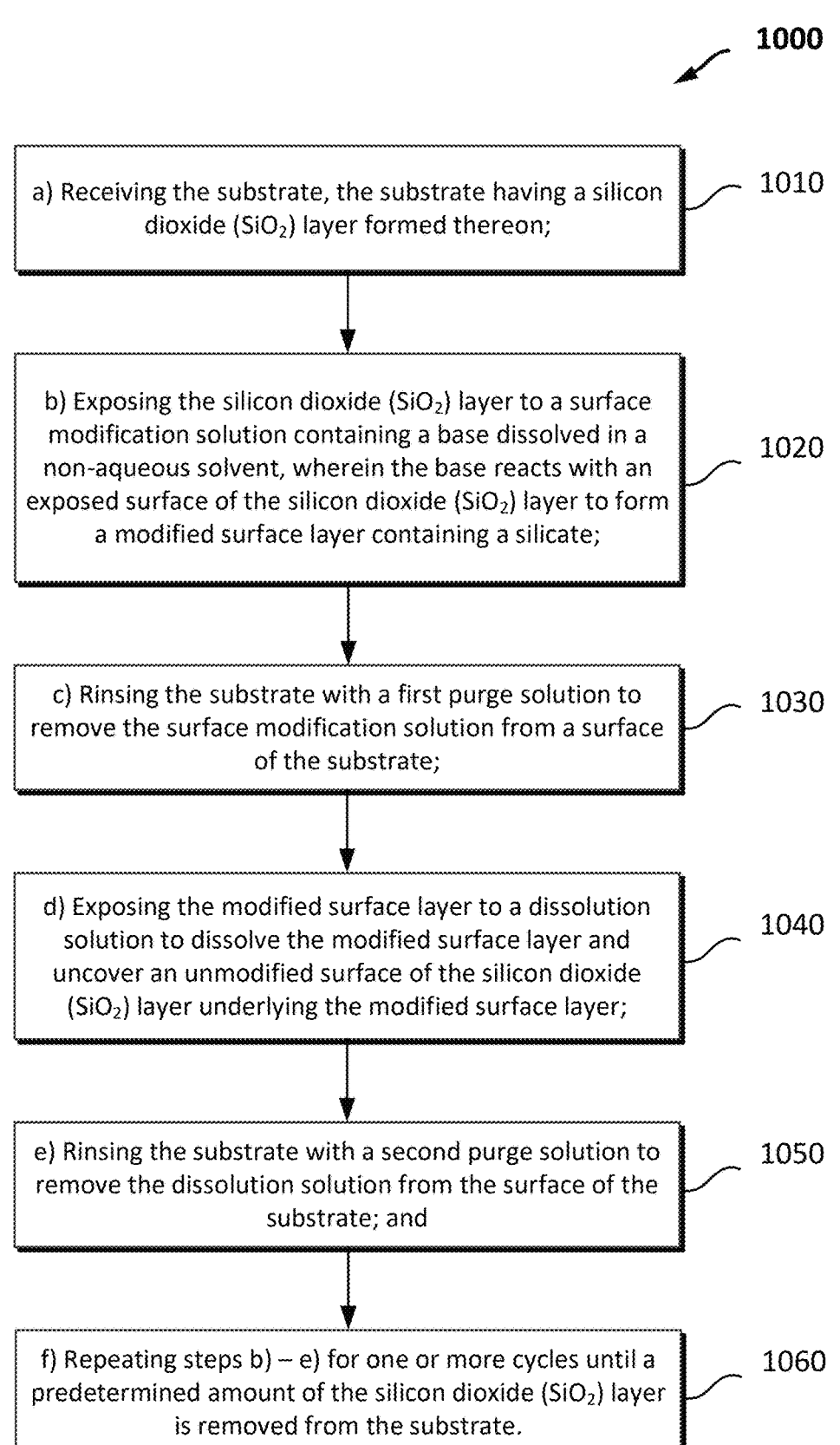

1000 a) Receiving the substrate, the substrate having a silicon dioxide (SiO₂) layer formed thereon;          1010 b) Exposing the silicon dioxide (SiO₂) layer to a surface modification solution containing a base dissolved in a non-aqueous solvent, wherein the base reacts with an exposed surface of the silicon dioxide (SiO₂) layer to form a modified surface layer containing a silicate;          1020 c) Rinsing the substrate with a first purge solution to remove the surface modification solution from a surface of the substrate;          1030 d) Exposing the modified surface layer to a dissolution solution to dissolve the modified surface layer and uncover an unmodified surface of the silicon dioxide (SiO₂) layer underlying the modified surface layer;          1040 e) Rinsing the substrate with a second purge solution to remove the dissolution solution from the surface of the substrate; and          1050 f) Repeating steps b) – e) for one or more cycles until a predetermined amount of the silicon dioxide (SiO₂) layer is removed from the substrate.          1060

*FIG. 10*

METHODS FOR WET ATOMIC LAYER ETCHING OF SILICON DIOXIDE

BACKGROUND

This disclosure relates to semiconductor device manufacturing, and, in particular, to the etching of oxide materials formed on semiconductor substrates.

As geometries of substrate structures continue to shrink and the types of structures evolve, the challenges of etching substrates have increased. One technique that has been utilized to address these challenges is atomic layer etching (ALE). ALE is a process that removes thin layers sequentially through one or more self-limiting reactions. For example, ALE typically refers to techniques that can etch with atomic precision, i.e., by removing material one or a few monolayers of material at a time. ALE processes generally rely on a chemical modification of the surface to be etched followed by a selective removal of the modified layer. Thus, ALE processes offer improved etch performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process leads to smoothing of the surface during etching rather than the roughening commonly seen during other etch processes.

A wet ALE process typically begins with a surface modification step, which exposes a material to a first solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

Silicon dioxide ($SiO_2$) continues to be an important material in the semiconductor industry and is commonly used as an insulator, dielectric, mask or sacrificial material. Traditional methods for etching $SiO_2$ include plasma etching with gas-phase hydrogen fluoride (HF) and wet etching with various hydrofluoric acid (HF) solutions. For example, a dilute hydrofluoric acid (HF) solution, a buffered oxide etch (BOE) solution (i.e., a mixture of HF and ammonium fluoride, $NH_4F$) and an HF and nitric acid ($HNO_3$) solution are traditionally used to provide fast, continuous etching of exposed $SiO_2$ surfaces. However, the traditional methods used for etching these materials are unsatisfactory, since plasma and wet etching methods tend to damage and/or cause roughening of the $SiO_2$ surface. In addition, the etch chemistries used in traditional wet etching methods result in a continuous wet etch, which is not selective to other silicon-containing materials (such as silicon and silicon nitride), which may be exposed on the substrate surface.

A need, therefore, exists for improved methods for etching $SiO_2$ in a wet ALE process and novel wet etch chemistries for selectively etching $SiO_2$ over other silicon-containing materials.

SUMMARY

The present disclosure provides a new wet atomic layer etch (ALE) process for etching silicon dioxide ($SiO_2$) materials. More specifically, the present disclosure provides various embodiments of methods that utilize new etch chemistries for etching $SiO_2$ materials in a cyclic wet ALE process. In the present disclosure, a wet ALE process for etching a $SiO_2$ layer starts with the formation of an insoluble silicate passivation layer on the $SiO_2$ surface. For example, the $SiO_2$ layer may be exposed to a surface modification solution in a self-limiting surface modification step to chemically modify an exposed surface of the $SiO_2$ layer and form a silicate passivation layer (a modified surface layer) thereon. The silicate passivation layer formed during the surface modification step is self-limiting and insoluble in the surface modification solution.

After surface modification, a dissolution step may be performed to selectively remove the silicate passivation layer from the underlying $SiO_2$ surface. Like the surface modification step, the dissolution step may also be self-limiting. For example, the silicate passivation layer may be exposed to a dissolution solution in which the silicate passivation layer is soluble, but the unmodified $SiO_2$ underlying the silicate passivation layer is insoluble. The dissolution solution selectively dissolves the silicate passivation layer without removing the unmodified $SiO_2$ underlying the silicate passivation layer. In some embodiments, the surface modification and dissolution steps may be repeated for one or more ALE cycles to repeatedly form a new silicate passivation layer and selectively remove the new silicate passivation layer, thus etching the $SiO_2$ layer one silicate passivation layer at a time.

New etch chemistries are also provided in the present disclosure for etching a $SiO_2$ layer using a wet ALE process. In the present disclosure, the surface modification solution is an anhydrous basic solution containing a base dissolved in non-aqueous solvent. The base reacts with the exposed surface of the $SiO_2$ layer to form the silicate passivation layer, and the dissolution solution selectively dissolves the silicate passivation layer to etch the $SiO_2$ layer. The dissolution solution can include a wide range of aqueous and non-aqueous solutions in which the silicate passivation layer is soluble, but the underlying, unmodified $SiO_2$ layer is insoluble.

Accordingly, a wet ALE process is disclosed herein for etching a $SiO_2$ layer using a novel wet etch chemistry. The wet etch chemistry disclosed herein uses an anhydrous basic solution to create self-limiting reactions on exposed surfaces of the $SiO_2$ layer and form a silicate passivation layer, which is insoluble in the surface modification solution, but readily soluble in the dissolution solution. Unlike conventional wet etch chemistries and processes used to etch $SiO_2$, the wet ALE process disclosed herein provides a new process for etching $SiO_2$ with a unique wet etch chemistry that is both self-limiting and selective to other silicon-containing compounds, such as silicon (Si) and silicon nitride ($Si_3N_4$). In some embodiments, metal-free wet etch chemistry with standard commercially available solutions may be used in the wet ALE process disclosed herein to avoid metal contamination on the $SiO_2$ surface. In addition to providing a self-limiting, selective etch of the $SiO_2$ surface, the wet ALE process and wet etch chemistries disclosed herein improve etch uniformity, provide greater control over the etch amount, and leave the post-etch $SiO_2$ surface smoother than the incoming $SiO_2$ surface.

As noted above and described further herein, the present disclosure provides various embodiments of methods that utilize new etch chemistries for etching a $SiO_2$ layer in a wet ALE process. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

According to one embodiment, a method of etching a silicon dioxide ($SiO_2$) layer is provided herein. The method may generally include receiving a substrate having a silicon dioxide ($SiO_2$) layer formed thereon, wherein a surface of the silicon dioxide ($SiO_2$) layer is exposed on a surface of the substrate, and exposing the surface of the substrate to a surface modification solution comprising a base dissolved in a non-aqueous solvent. When exposed to the surface modification solution, the base reacts with the surface of the silicon dioxide ($SiO_2$) layer to form a silicate passivation layer, which is self-limited and insoluble in the surface modification solution. Next, the method may include removing the surface modification solution from the surface of the substrate subsequent to forming the silicate passivation layer, and exposing the surface of the substrate to a dissolution solution that selectively dissolves the silicate passivation layer. Next, the method may include removing the dissolution solution from the substrate to etch the silicon dioxide ($SiO_2$) layer.

In some embodiments, the method may further include repeating the steps of exposing the surface of the substrate to the surface modification solution, removing the surface modification solution, exposing the surface of the substrate to the dissolution solution, and removing the dissolution solution a number of cycles until a predetermined amount of the silicon dioxide ($SiO_2$) layer is removed from the substrate.

According to another embodiment, a method etching a silicon dioxide ($SiO_2$) layer using a wet atomic layer etching (ALE) process is provided herein. The method may generally include: a) receiving a substrate, the substrate having the silicon dioxide ($SiO_2$) layer formed thereon; b) exposing the silicon dioxide ($SiO_2$) layer to a surface modification solution containing a base dissolved in a non-aqueous solvent, wherein the base reacts with an exposed surface of the dioxide ($SiO_2$) layer to form a modified surface layer containing a silicate; c) rinsing the substrate with a first purge solution to remove the surface modification solution from a surface of the substrate; d) exposing the modified surface layer to a dissolution solution to dissolve the modified surface layer and uncover an unmodified surface of the silicon dioxide ($SiO_2$) layer underlying the modified surface layer; e) rinsing the substrate with a second purge solution to remove the dissolution solution from the surface of the substrate; and f) repeating steps b)-e) for one or more cycles until a predetermined amount of the silicon dioxide ($SiO_2$) layer is removed from the substrate.

A variety of different etch chemistries may be used in the surface modification and dissolution solutions used in the method embodiments discussed above. For example, the surface modification solution may generally include a base dissolved in a non-aqueous solvent. As described in more detail below, the base included within the surface modification solution may be a hydroxide or a carbonate salt.

In some embodiments, the base included within the surface modification solution may be a hydroxide having $R^+$ cations and $OH^-$ anions. When a hydroxide is included within the surface modification solution, the reactive species (the $R^+$ cations and $OH^-$ anions) in the surface modification solution may react with the surface of the silicon dioxide ($SiO_2$) layer to form the silicate passivation layer in a self-limiting reaction. The silicate passivation layer formed in such embodiments may have a chemical formula of $R_{2x}Si_yO_{2y+x}$, where the ratio of x:y ranges from 0.25 to 2. The $R^+$ cations within the hydroxide may be alkali metal cations (such as sodium cations ($Na^-$), potassium cations ($K^-$), etc.), alkali earth metal cations (such as magnesium ($Mg^{2+}$), calcium ($Ca^{2+}$), etc.), ammonium cations ($NH_4^-$), or quaternary ammonium cations (such as tetramethylammonium ($N(CH_3)_4^+$), tetrabutylammonium ($[N(C_4H_9)_4]^+$), choline ($[(CH_3)_3NCH_2CH_2OH]^+$), etc.). In some embodiments, sodium hydroxide (NaOH), potassium hydroxide (KOH), magnesium hydroxide ($Mg(OH)_2$), calcium hydroxide ($Ca(OH)_2$), ammonium hydroxide ($NH_4OH$), tetramethylammonium hydroxide (TMAH, $N(CH_3)_4OH$), tetrabutylammonium hydroxide ($C_{16}H_{37}NO$) or choline hydroxide ($[(CH_3)_3NCH_2CH_2OH]^+OH^-$) may be included within the surface modification solution.

In other embodiments, the base included within the surface modification solution may be a carbonate salt having $R''^+$ cations and $CO_3^{2-}$ anions. When a carbonate salt is included within the surface modification solution, the reactive species (the $R''^+$ cations and $CO_3^{2-}$ anions) in the surface modification solution may react with the surface of the silicon dioxide ($SiO_2$) layer to form the silicate passivation layer in a self-limiting reaction. The silicate passivation layer formed in such embodiments may have a chemical formula of $R_{2x}Si_yO_{2y+x}$, where the ratio of x:y ranges from 0.25 to 2. The $R''^+$ cations within the carbonate salt may be alkali metal cations (such as sodium cations ($Na^+$), potassium cations ($K^+$), etc.), alkali earth metal cations (such as magnesium ($Mg^{2+}$), calcium ($Ca^{2+}$), etc.), ammonium cations ($NH_4^+$), or quaternary ammonium cations (such as tetramethylammonium ($N(CH_3)_4^+$), tetrabutylammonium ($[N(C_4H_9)_4]^+$), choline ($[(CH_3)_3NCH_2CH_2OH]^+$), etc.). In some embodiments, sodium carbonate ($Na_2CO_3$), potassium carbonate ($K_2CO_3$), magnesium carbonate ($MgCO_3$), calcium carbonate ($CaCO_3$), ammonium carbonate ($(NH_4)_2CO_3$), tetramethylammonium carbonate ($(N(CH_3)_4CO_3)$), tetrabutylammonium carbonate ($C_{33}H_{72}N_2O_3$) or choline carbonate ($C_6H_{14}NO_3^+$) may be included within the surface modification solution.

The non-aqueous solvent included within the surface modification solution may generally comprise an alcohol, an ether, a ketone, a halocarbon, a heterocyclic or another polar organic solvent. Non-exclusive examples of non-aqueous solvents that may be included within the surface modification solution include methanol, isopropyl alcohol, ethanol, dimethyl sulfoxide, acetonitrile, ethyl acetate, acetone, furans, dimethylformamide, and dioxane. As described further herein, the non-aqueous solvent selected for use within the surface modification solution is preferably a polar non-aqueous solvent, which is sufficient to dissolve a given base without reacting with the base.

The dissolution solution may generally include an aqueous solution or a non-aqueous solution in which the silicate passivation layer is soluble. When the silicate passivation layer is exposed to a dissolution solution containing an aqueous solvent, the silicate passivation layer is dissolved by the aqueous solvent. When the silicate passivation layer is exposed to a dissolution solution containing a non-aqueous solvent, the silicate passivation layer is dissolved by the non-aqueous solvent. Examples of non-aqueous solvents that may be included in the dissolution solution include, but are not limited to, ethylene glycol and glycerol.

The first purge solution and the second purge solution may each include a wide variety of non-aqueous organic solvents, including but not limited to, alcohols, ethers, ketones, halocarbons, heterocyclic or other polar organic solvents. Non-exclusive examples of non-aqueous solvents that may be included within the first and the second purge solutions include methanol, isopropyl alcohol, ethanol, dimethyl sulfoxide, acetonitrile, ethyl acetate, acetone, furans, dimethylformamide, isopropanol and dioxane. In some embodiments, the first purge solution and the second purge solution may each include an alcohol, such as methanol ($CH_3OH$) or isopropyl alcohol (IPA, $C_3H_8O$). The absence of water in the first purge solution is desirable since it prevents continuous etch of the silicon dioxide ($SiO_2$) layer and loss of selectivity to silicon (Si). In some embodiments, the first purge solution may include the same non-aqueous solvent used in the surface modification solution. The second purge solution may include the same non-aqueous solvent used in the first purge solution or may use a different non-aqueous solvent.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1 illustrates one example of a cyclic wet atomic layer etching (ALE) process that can be used to etch a silicon dioxide ($SiO_2$) layer in accordance with the present disclosure.

6

Figure 2:
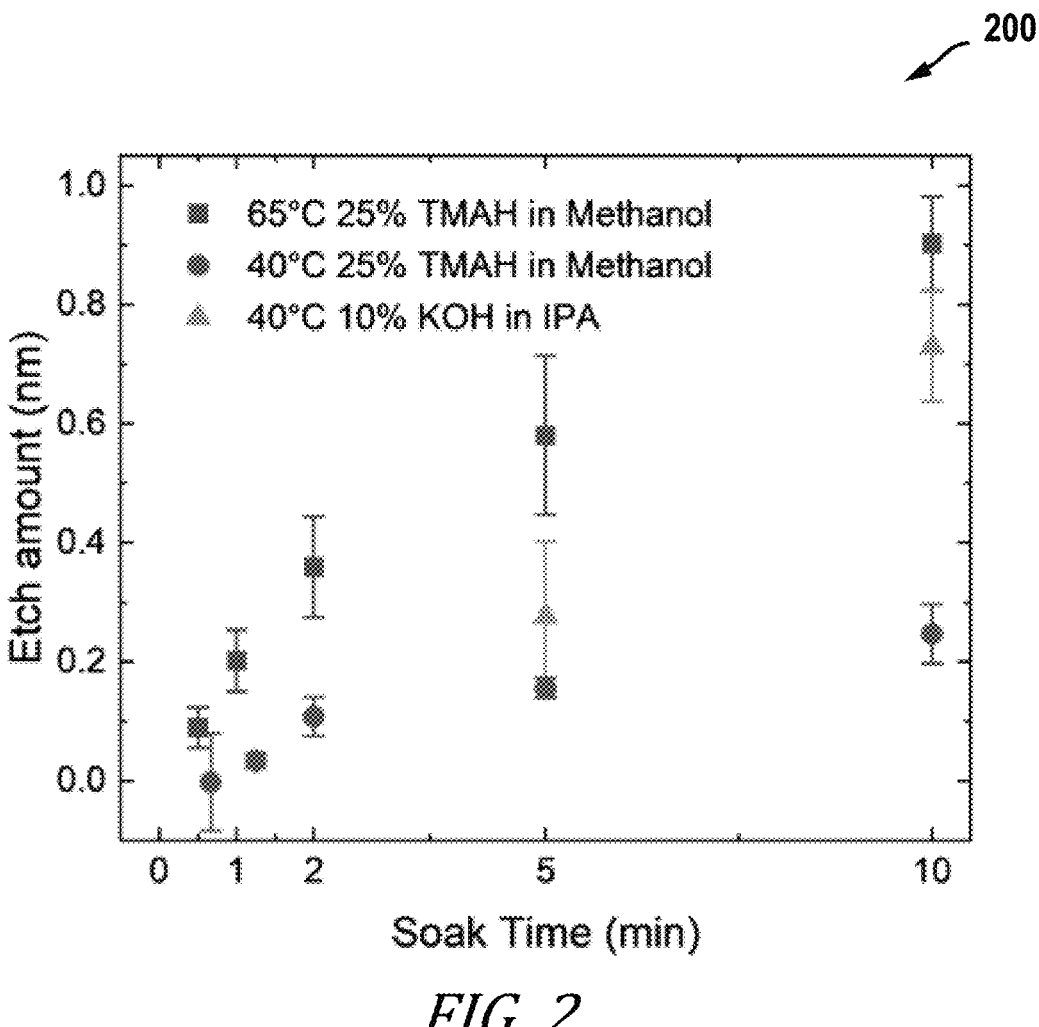

FIG. 2 is a graph of etch results obtained from a wet ALE process experiment, which used various wet etch chemistries in accordance with the present disclosure to etch a silicon dioxide ($SiO_2$) layer.

Figure 3:
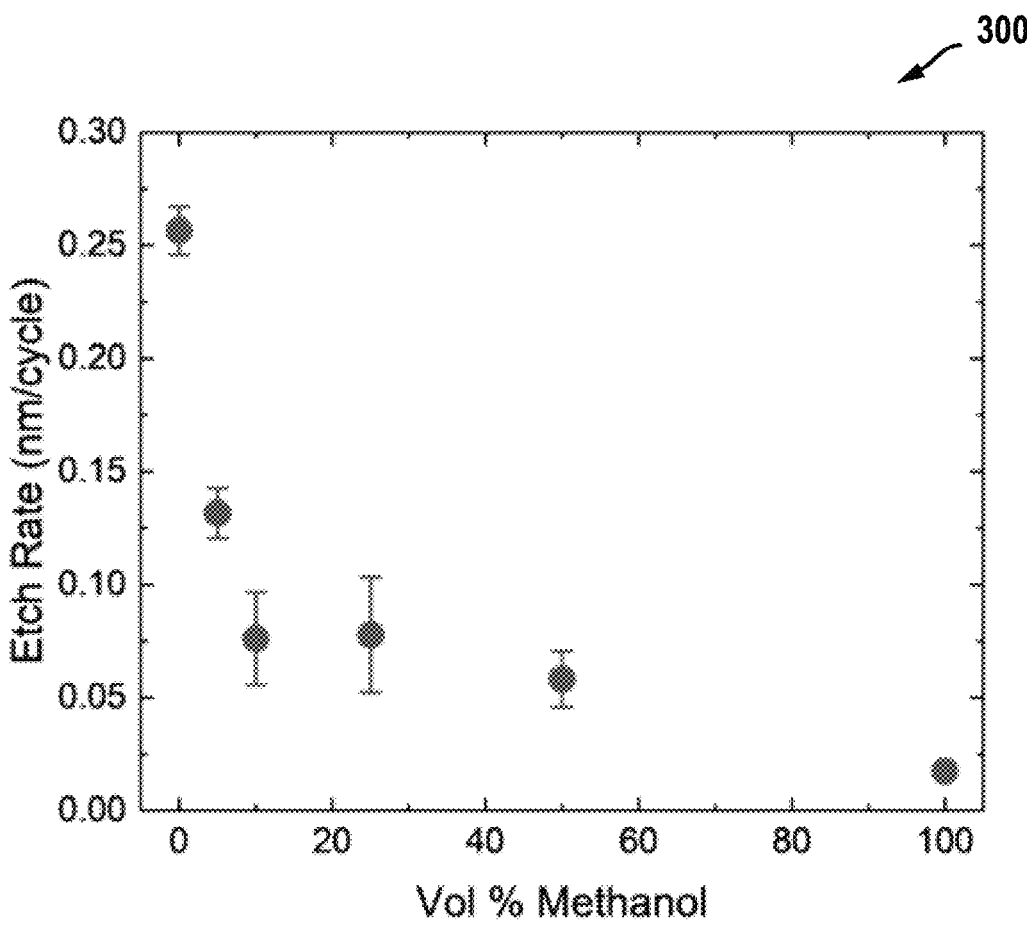

FIG. 3 is a graph depicting the cyclic etch rates obtained from a wet ALE process experiment, which varied the concentration of methanol and IPA in a surface modification solution containing 10% potassium hydroxide (KOH).

Figure 4:
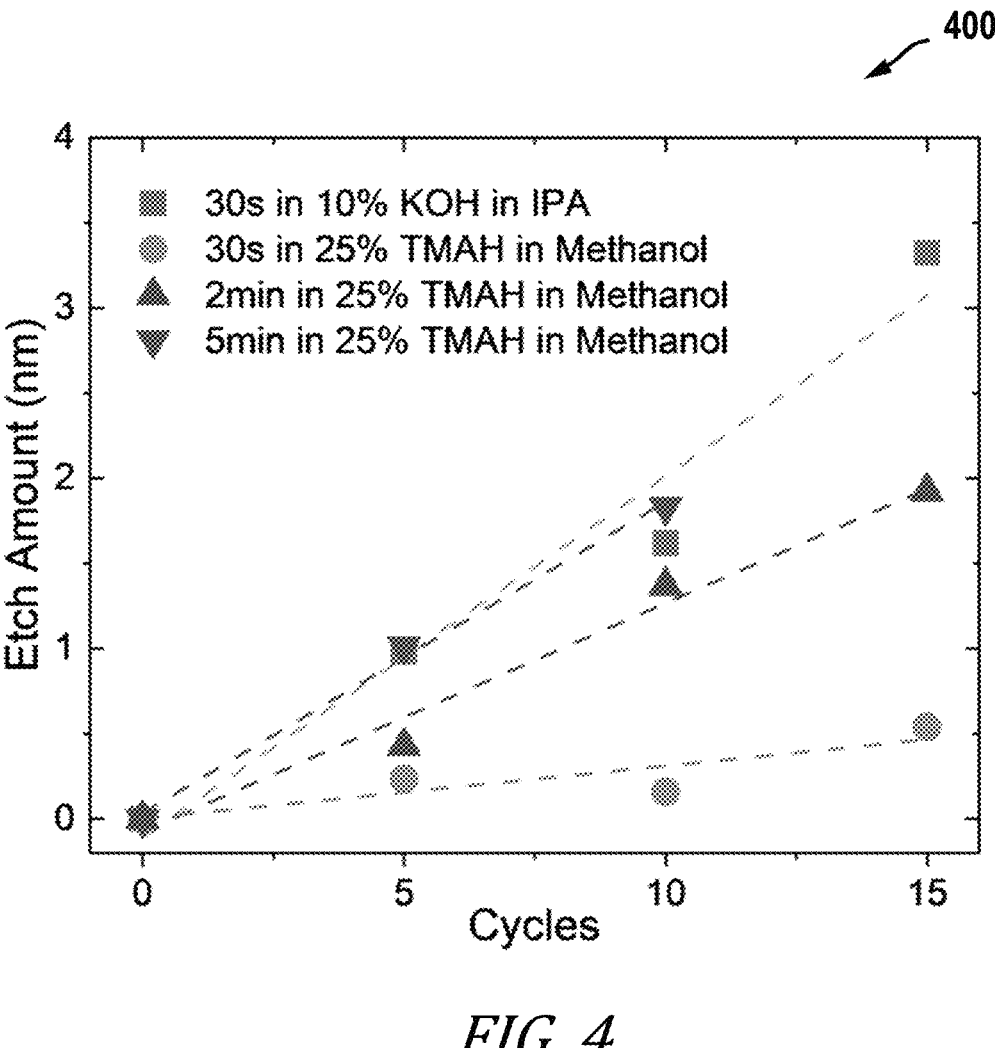

FIG. 4 is a graph depicting cumulative etch amounts achieved in cyclic wet ALE etch experiments using various surface modification solutions and soak times followed by a 30 second soak in deionized (DI) water.

Figure 5A:
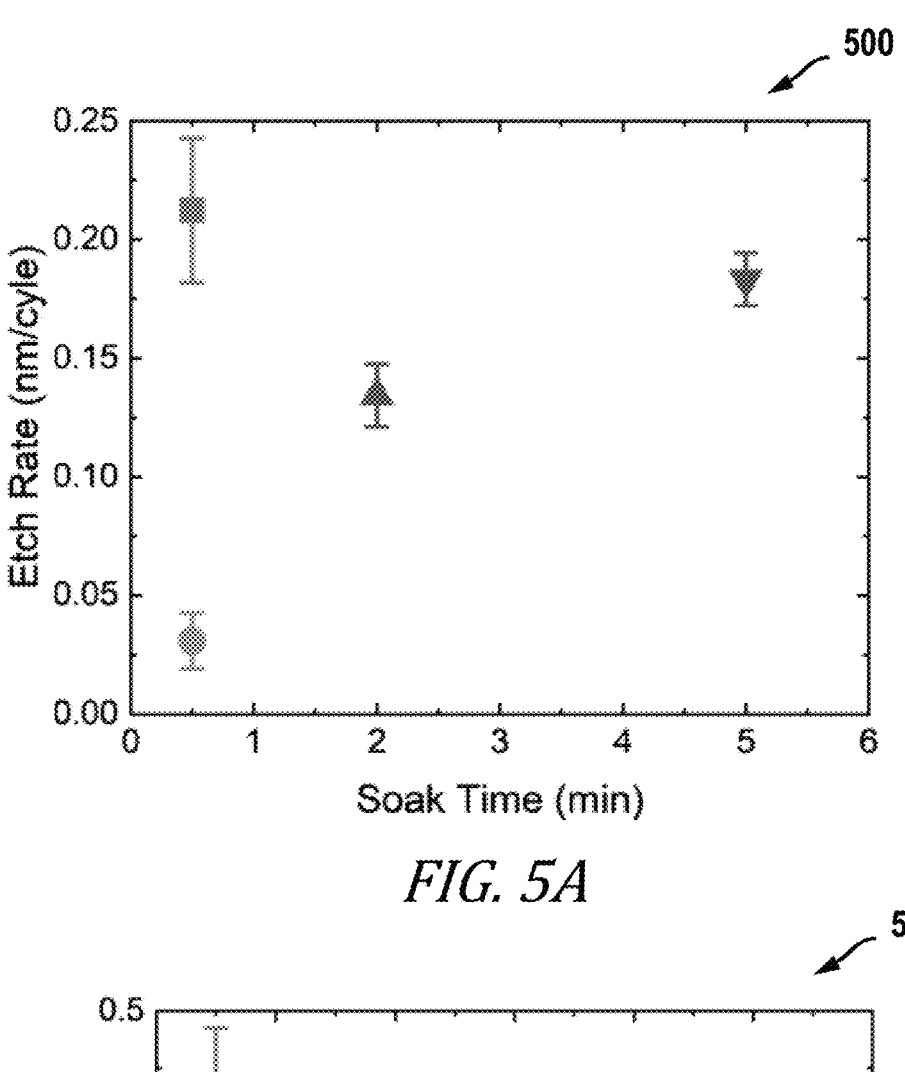

FIG. 5A is a graph depicting the etch rate per ALE cycle achieved for the various surface modification solutions and soak times shown in FIG. 4.

Figure 5B:
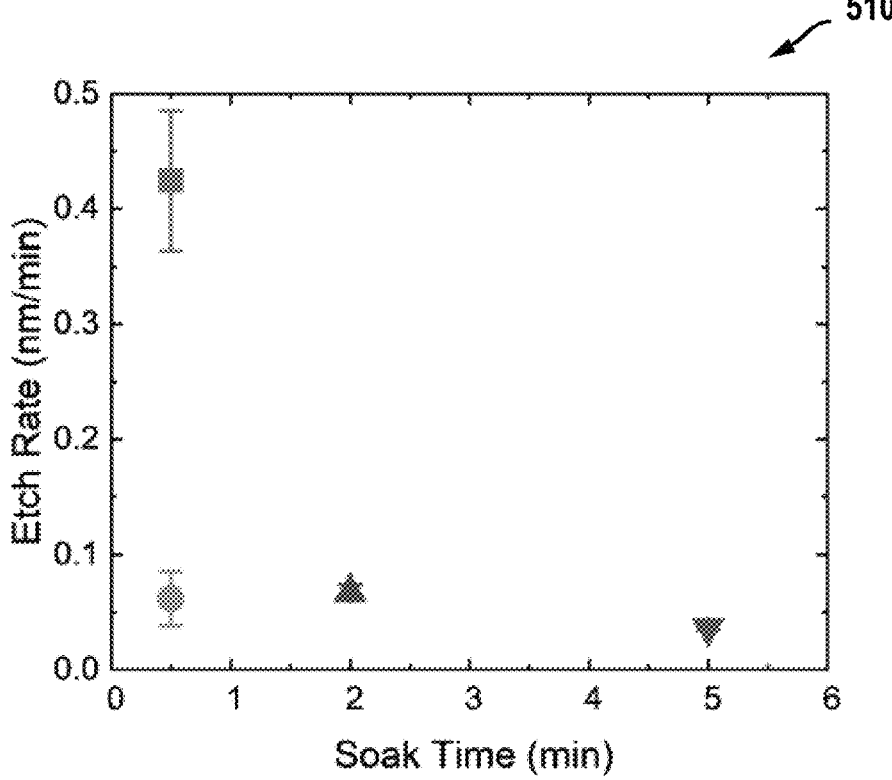

FIG. 5B is a graph depicting the etch rate per minute achieved for the various surface modification solutions and soak times shown in FIG. 4.

Figure 6A:
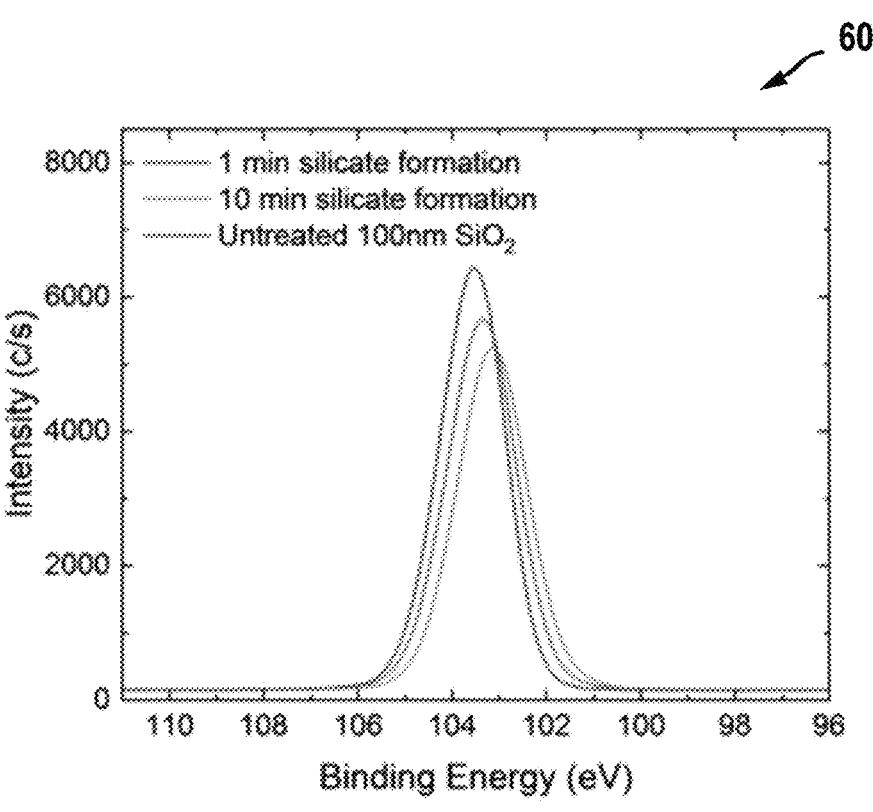
Figure 6B:
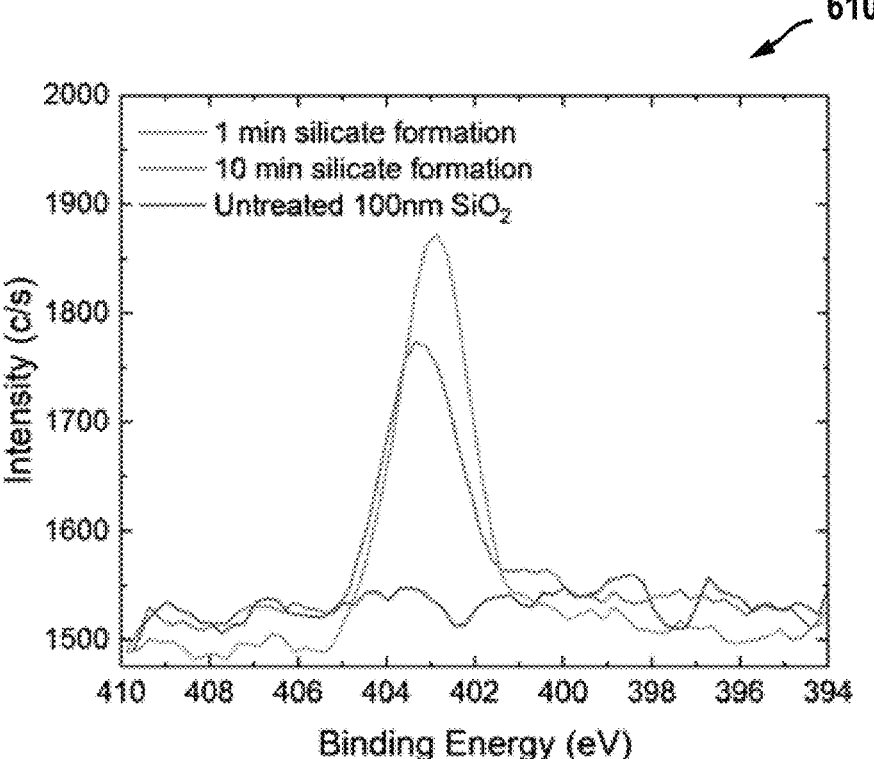

FIGS. 6A-6B are graphs of x-ray photoelectron spectroscopy (XPS) data obtained from a wet ALE process experiment, which used a 25% TMAH in methanol surface modification solution at 65° C. followed by a 30 second soak in deionized (DI) water to etch a silicon dioxide ($SiO_2$) layer.

Figure 7:
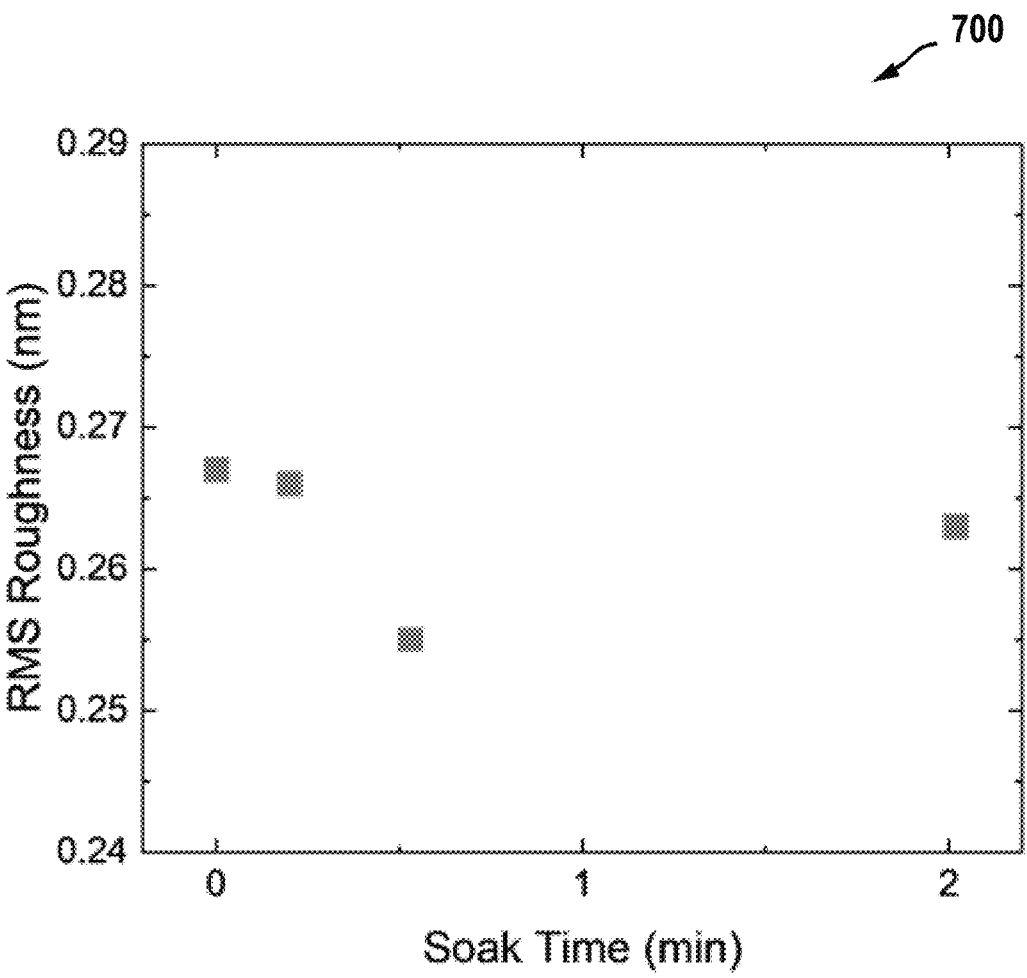

FIG. 7 is a graph of atomic force microscopy (AFM) data obtained from a wet ALE process experiment, which used a 25% TMAH in methanol surface modification solution at 65° C. followed by a 30 second soak in deionized (DI) water to etch a silicon dioxide ($SiO_2$) layer, the graph depicting the root mean square (RMS) roughness of the post-etch silicon dioxide ($SiO_2$) surface plotted against surface modification solution soak time.

Figure 8:
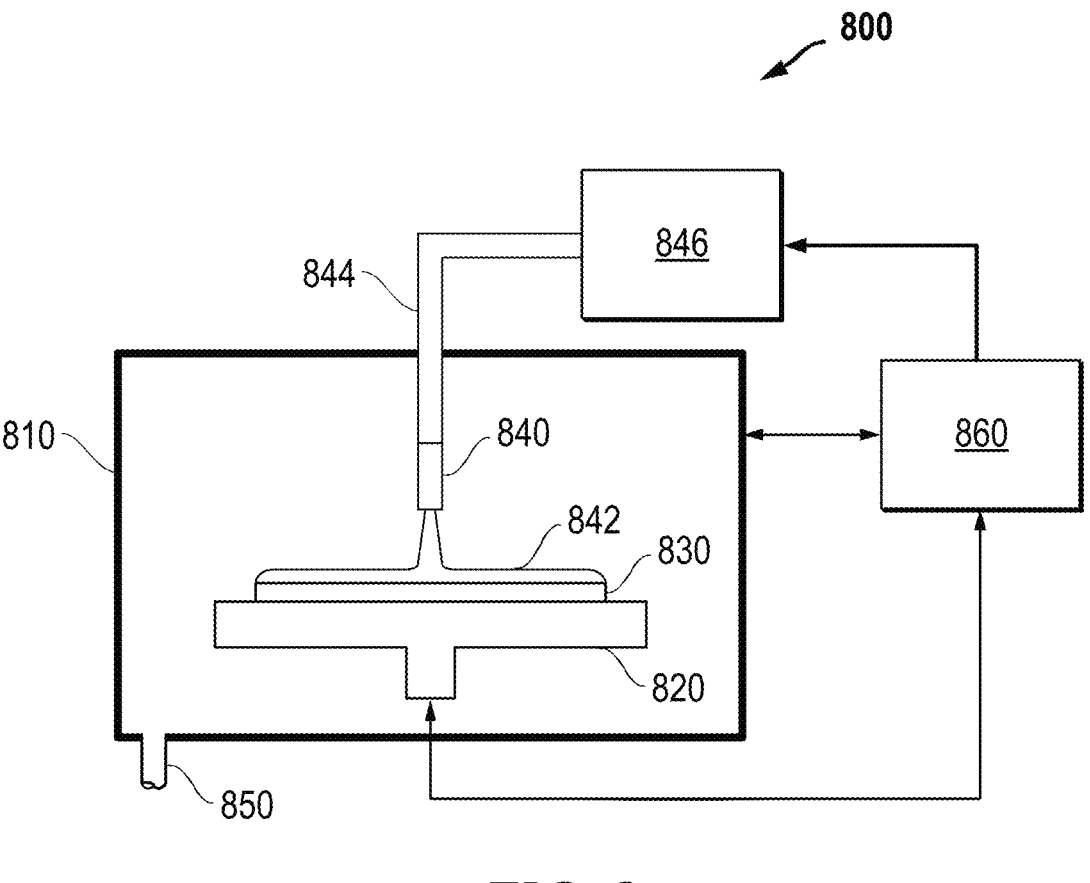

FIG. 8 is a block diagram of an example processing system that uses the techniques described herein to etch a silicon dioxide ($SiO_2$) layer.

FIG. 9 is a flowchart diagram illustrating an embodiment of a method that utilizes the techniques described herein to etch a silicon dioxide ($SiO_2$) layer.

FIG. 10 is a flowchart diagram illustrating an embodiment of a method that utilizes the techniques described herein to etch a silicon dioxide ($SiO_2$) layer using a wet ALE process.

DETAILED DESCRIPTION

The present disclosure provides a new wet atomic layer etch (ALE) process for etching silicon dioxide ($SiO_2$) materials. More specifically, the present disclosure provides various embodiments of methods that utilize new etch chemistries for etching $SiO_2$ materials in a cyclic wet ALE process.

In general, the wet ALE process described herein can be used to etch a silicon dioxide ($SiO_2$) layer by performing one or more cycles of the wet ALE process, where each cycle includes a surface modification step and a dissolution step. In the surface modification step, an exposed surface of the $SiO_2$ layer is exposed to a surface modification solution to chemically modify the exposed surface of the $SiO_2$ layer and form a modified surface layer (e.g., a silicate passivation layer). In the dissolution step, the modified surface layer is selectively removed by exposing the modified surface layer to a dissolution solution, which reacts with the modified surface layer to produce soluble species that are dissolved by the dissolution solution. Purge steps may be performed between the surface modification and dissolution steps to prevent the surface modification and dissolution solutions from mixing, and the process may be repeated in a cyclic manner until a desired amount of etching is achieved.

Figure 1:
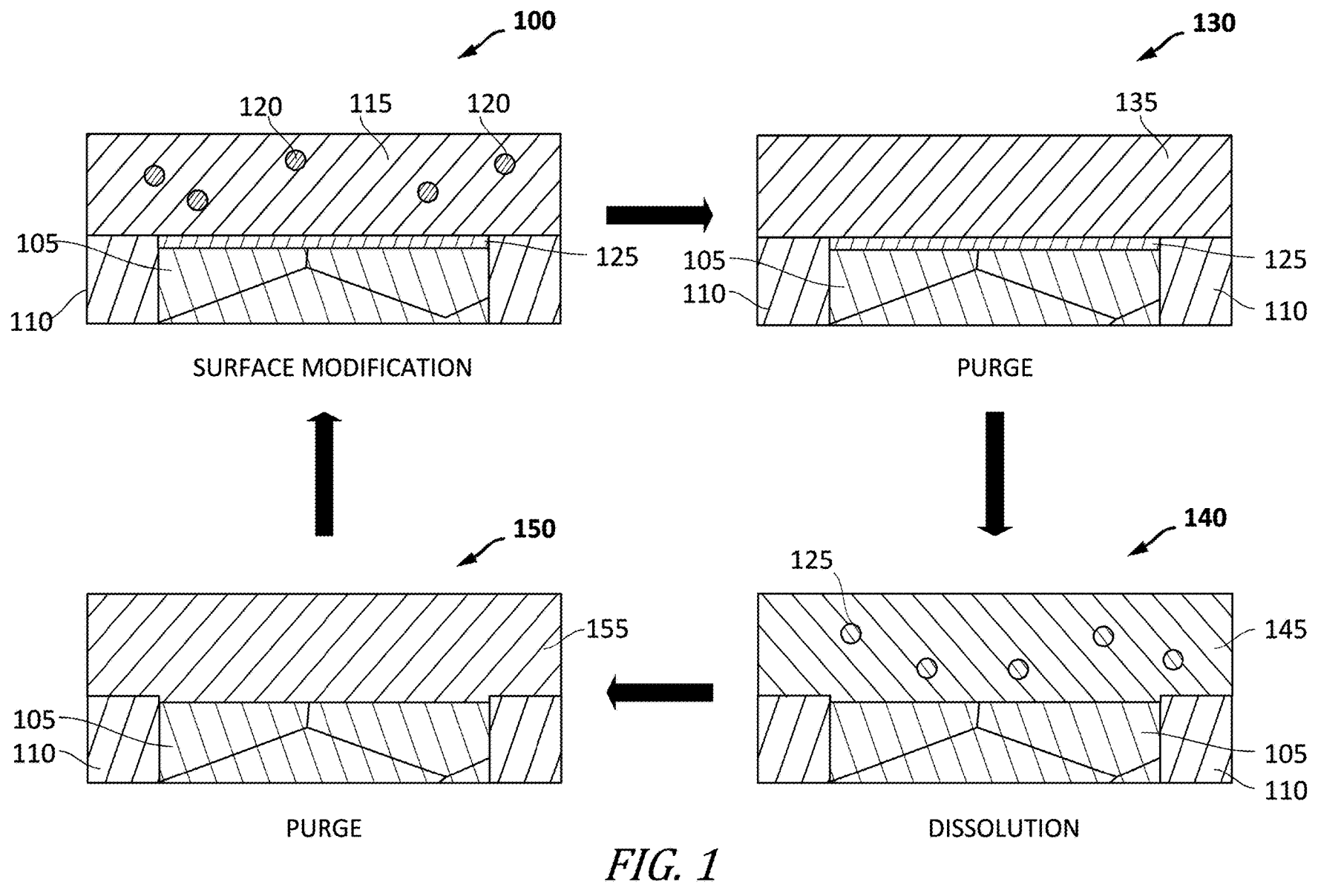

FIG. 1 illustrates one example of a wet ALE process in accordance with the present disclosure. More specifically, FIG. 1 illustrates exemplary steps performed during one cycle of a wet ALE process. In the process shown in FIG. 1, a silicon dioxide ($SiO_2$) material 105 surrounded by another material 110 is brought in contact with a surface modification solution 115 during a surface modification step 100 to modify an exposed surface of the $SiO_2$ material 105. In some embodiments, the material 110 surrounding the $SiO_2$ material 105 may be another silicon-containing material, such as silicon (Si) or silicon nitride ($Si_3N_4$), or another material commonly used in semiconductor fabrication.

When exposed to the surface modification solution 115, a chemical reaction occurs at the exposed surface of the $SiO_2$ material 105 to form a modified surface layer 125 in the surface modification step 100. The chemical reaction to form the modified surface layer 125 may be fast and self-limiting. In other words, the reaction product may modify one or more monolayers of the exposed surface of the $SiO_2$ material 105, but may prevent any further reaction between the surface modification solution 115 and the underlying surface. By necessity, neither the $SiO_2$ material 105 to be etched nor the modified surface layer 125 can be soluble in the surface modification solution 115. In some cases, the surface modification step 100 shown in FIG. 1 may continue until the surface reaction is driven to saturation.

The surface modification solution 115 used in the surface modification step 100 is an anhydrous basic solution containing a base 120 dissolved in non-aqueous solvent. The base 120 included within the surface modification solution 115 reacts with the exposed surface of the $SiO_2$ material 105 to modify the exposed $SiO_2$ surface and form the modified surface layer 125 on the underlying $SiO_2$ material 105. More specifically, the base 120 includes reactive species that: (a) react with the exposed $SiO_2$ surface to form a silicate passivation layer on the underlying $SiO_2$ material 105, but (b) do not react with the non-aqueous solvent included within the surface modification solution 115.

The surface modification solution 115 may include a wide variety of an anhydrous basic solutions that form silicates on $SiO_2$ surfaces. For example, the base 120 may include a hydroxide or a carbonate salt, and the non-aqueous solvent may be a polar organic solvent. More specific examples of suitable bases and solvents that can be included within the surface modification solution 115 are discussed in more detail below. In some embodiments, non-metal hydroxides and carbonate salts may be preferred over metal-based hydroxides and carbonate salts to provide a metal-free etch chemistry.

After the modified surface layer 125 (e.g., the silicate passivation layer) is formed in the surface modification step 100, the substrate may be rinsed with a first purge solution 135 to remove excess reactants from the surface of the substrate in a first purge step 130. The first purge solution 135 should not react with the modified surface layer 125 or with the reagents present in the surface modification solution 115. In some embodiments, the first purge solution 135 used in the first purge step 130 may use the same non-aqueous solvent previously used in the surface modification step 100. In other embodiments, a different solvent may be used in the first purge solution 135. In some embodiments, the first purge step 130 may be long enough to completely remove all excess reactants from the substrate surface.

Once rinsed, a dissolution step 140 is performed to selectively remove the modified surface layer 125. In the dissolution step 140, the modified surface layer 125 is exposed to a dissolution solution 145 to selectively remove or dissolve the modified surface layer 125 to etch the $SiO_2$ material 105. The modified surface layer 125 must be soluble in the dissolution solution 145, while the unmodified $SiO_2$ material 105 underlying the modified surface layer 125 must be insoluble. The solubility of the modified surface layer 125 allows its removal through dissolution into the bulk dissolution solution 145. In some embodiments, the dissolution step 140 may continue until the modified surface layer 125 is completely dissolved.

A variety of different dissolution solutions 145 may be used in the dissolution step 140, depending on the surface modification solution 115 used and/or the modified surface layer 125 formed during the surface modification step 100. In some embodiments, the dissolution solution 145 may be an aqueous solvent (such as deionized water) in which the modified surface layer 125 is soluble. In other embodiments, a non-aqueous solvent (e.g., an alkylene glycol, such as ethylene glycol) may be used in the dissolution solution 145 to form a soluble species that dissolves within the dissolution solution 145. Regardless of the particular dissolution solution 145 used, the dissolution step 140 selectively removes the modified surface layer 125 without removing the unmodified $SiO_2$ material 105 underlying the modified surface layer 125.

Once the modified surface layer 125 is selectively removed, the ALE etch cycle shown in FIG. 1 is completed by performing a second purge step 150. The second purge step 150 is performed by rinsing the surface of the substrate with a second purge solution 155, which may be the same or different than the first purge solution 135. In some embodiments, the second purge solution 155 may use the same non-aqueous solvent that was used in the surface modification solution 115 and/or the first purge solution 135. The second purge step 150 may generally continue until the dissolution solution 145 and/or the reactants contained with the dissolution solution 145 are completely removed from the surface of the substrate.

As described above, the cyclic wet ALE process shown in FIG. 1 includes: a) a surface modification step 100 that exposes the exposed surfaces of a $SiO_2$ material 105 to a surface modification solution 115, which chemically modifies the exposed surfaces of the $SiO_2$ material 105 to form a modified surface layer 125; b) a first purge step 130 to rinse the substrate with a first purge solution 135 to remove excess reactants from the surface; c) a dissolution step 140 that exposes the modified surface layer 125 to a dissolution solution 145 to selectively remove or dissolve the modified surface layer 125; and d) a second purge step 150 to rinse the substrate with a second purge solution 155 and remove the dissolution solution 145 from the surface of the substrate. In some embodiments, the steps a)-d) may be repeated for one or more ALE cycles, until a desired amount of the $SiO_2$ material 105 has been removed. It is recognized that the cyclic wet ALE process shown in FIG. 1 is merely one example of an etch process that may be used to etch the $SiO_2$ material 105.

As described above, the wet ALE process shown in FIG. 1 requires the formation of a self-limiting or quasi-self-limiting passivation layer on the $SiO_2$ surface. The formation of this passivation layer is accomplished by exposure of the $SiO_2$ surface to a first etch solution (i.e., surface modification solution 115) that enables or causes a chemical reaction between the reactive species in the surface modification solution and the $SiO_2$ surface. This passivation layer must be insoluble in the solution used for its formation, but freely soluble in the second etch solution (i.e., dissolution solution 145) used for its dissolution.

The present disclosure contemplates a wide variety of etch chemistries that can be used in the surface modification solution 115 and the dissolution solution 145 when etching a $SiO_2$ layer using the wet ALE process shown in FIG. 1. Example etch chemistries are discussed in more detail below. Mixing of these solutions leads to a continuous etch process, loss of control of the etch and roughening of the post-etch surface, all of which undermines the benefits of wet ALE. Thus, purge steps 130 and 150 are performed in the wet ALE process shown in FIG. 1 to prevent direct contact between the surface modification solution 115 and the dissolution solution 145 on the substrate surface.

As noted above, the surface modification solution 115 may generally include a base 120 dissolved in non-aqueous solvent. The base 120 includes reactive species that react with the exposed $SiO_2$ surface to form a silicate passivation layer, but do not react with the non-aqueous solvent included within the surface modification solution 115. For example, the base 120 may include a wide variety of hydroxides and carbonate salts. Examples of suitable hydroxides include, but are not limited to, sodium hydroxide ($Na^+OH^-$), potassium hydroxide ($K^+OH^-$), magnesium hydroxide ($Mg^+$ $(OH^-)_2$), calcium hydroxide ($Ca^+(OH^-)_2$), ammonium hydroxide ($NH_4^+OH^-$), tetramethylammonium hydroxide (TMAH, $N(CH_3)_4^+OH^-$), tetrabutylammonium hydroxide ($C_{16}H_{37}NO$), choline hydroxide ($[(CH_3)_3NCH_2CH_2OH]^+$ $OH^-$) and other hydroxides of alkali metal cations, alkali earth metal cations, ammonium cations and quaternary ammonium cations. Examples of suitable carbonate salts include, but are not limited to, sodium carbonate ($Na_2^+$ $CO_3^{2-}$), potassium carbonate ($K_2^+CO_3^{2-}$), magnesium carbonate ($Mg^{2+}CO_3^{2-}$), calcium carbonate ($Ca^{2+}CO_3^{2-}$), ammonium carbonate ($(NH_4)_2^+CO_3^{2-}$), tetramethylammonium carbonate ($N(CH_3)_4^+CO_3^{2-}$), tetrabutylammonium carbonate ($C_{33}H_{72}N_2O_3$), choline carbonate ($C_6H_{14}NO_3^+$), other carbonates of alkali metal cations, alkali earth metal cations, ammonium cations, quaternary ammonium cations and guanidinium cations, and hydrogen carbonates of ammonium cations, quaternary ammonium cations and guanidinium cations. As such, the reactive species within the base 120 may include: (i) a hydroxide ion (OH) or a carbonate anion ($CO_3^{2-}$), and (ii) an alkali metal cation (e.g., $Na_x^+$, $K_x^+$, etc.), an alkali earth metal cation (e.g., $Ca^{2+}$, $Mg^{2+}$, etc.), an ammonium cation (e.g., $(NH_4)_x^+$, $N(CH_3)_4^+$, etc.) or other organic cation.

A wide variety of non-aqueous solvents may be used within the surface modification solution 115, depending on the particular base 120 selected. For example, the non-aqueous solvent may be an alcohol, an ether, a ketone, a halocarbon, a heterocyclic or another polar organic solvent. Specific examples of non-aqueous solvents that may be used within the surface modification solution 115 include, but are not limited to, methanol, isopropyl alcohol, ethanol, dimethyl sulfoxide, acetonitrile, ethyl acetate, acetone, furans, dimethylformamide, isopropanol and dioxane. Other non-aqueous solvents not specifically mentioned herein may also be used within the surface modification solution 115, as long as the base 120 does not react with the chosen solvent.

The wet ALE process shown in FIG. 1 and described herein uses an anhydrous basic solution containing a base dissolved in non-aqueous solvent to form an insoluble silicate passivation layer over the unmodified $SiO_2$ material 105 in a self-limiting surface modification step 100. The silicate formation reaction continues on the exposed $SiO_2$ surface until the surface is fully covered by a silicate passivation layer, which remains on the $SiO_2$ surface due to its insolubility in the organic solvent used within the surface modification solution 115. Thus, the self-limiting quality of the surface modification step 100 comes from the absence of water in the surface modification solution 115 and the insolubility of silicates in most organic solvents.

According to one embodiment, the $SiO_2$ surface may be exposed to a surface modification solution 115 containing a hydroxide dissolved in non-aqueous solvent in the surface modification step 100 to form a silicate passivation layer on the $SiO_2$ surface that is self-limiting and insoluble in the non-aqueous solvent. The hydroxide included within the surface modification solution 115 may have a chemical formula of $R^+OH^-$, where the $R^+$ cation is selected from a group comprising sodium ($Na^+$), potassium ($K^+$), magnesium ($Mg^+$), calcium ($Ca^+$), ammonium ($NH_4^+$), tetramethylammonium ($N(CH_3)_4^+$), tetrabutylammonium ($[N(C_4 H_9)_4]^+$), choline ($[(CH_3)_3NCH_2CH_2OH]^+$), etc. Examples of hydroxide-based surface modification solutions include, but are not limited to, 25% TMAH dissolved in methanol, 10% KOH dissolved in methanol and 10% KOH dissolved in IPA. When a $SiO_2$ surface is exposed to a surface modification solution 115 containing a hydroxide dissolved in non-aqueous solvent, a chemical reaction between the reactive species (e.g., the $R^+$ cations and OH anions) in the surface modification solution 115 and the $SiO_2$ surface forms a self-limiting, silicate passivation layer having the formula $R_{2x}Si_yO_{2y+x}$, where the ratio of x:y ranges from 0.25 to 2.

According to another embodiment, the $SiO_2$ surface may be exposed to a surface modification solution 115 containing a carbonate salt dissolved in non-aqueous solvent in the surface modification step 100 to form a silicate passivation layer on the $SiO_2$ surface that is self-limiting and insoluble in the non-aqueous solvent. The carbonate salt included within the surface modification solution 115 may have a chemical formula of $R''^+{}_{2/n}CO_3^{2-}$, where the $R''^+$ cation is selected from a group comprising sodium ($Na_2^+$), potassium ($K_2^+$), magnesium ($Mg^{2+}$), calcium ($Ca^{2+}$), ammonium ($(NH_4)_2^+$), tetramethylammonium ($N(CH_3)_4^+$), tetrabutylammonium ($[N(C_4H_9)_4]^+$), choline ($[(CH_3)_3 NCH_2CH_2OH]^+$), etc. When a $SiO_2$ surface is exposed to a surface modification solution 115 containing a carbonate salt dissolved in non-aqueous solvent, a chemical reaction between the reactive species (e.g., the $R''^+$ cations and $CO_3^{2-}$ anions) in the surface modification solution 115 and the $SiO_2$ surface forms a self-limiting, silicate passivation layer having the formula $R_{2x}Si_yO_{2y+x}$, where the ratio of x:y ranges from 0.25 to 2.

The self-limiting, silicate passivation layer formed during the surface modification step 100 must be removed every cycle after its formation. After rinsing the substrate with a first purge solution 135, a dissolution solution 145 is used in the dissolution step 140 to selectively dissolve the silicate passivation layer. This can be done using deionized (DI) water, since most silicates are soluble in water, but non-aqueous solvents may also be used. Examples of non-aqueous solvents that may be included in the dissolution solution 145 include, but are not limited to, ethylene glycol and glycerol.

After the dissolution step 140, the substrate can be rinsed with a second purge solution 155 to remove the dissolution solution 145 and the soluble species therein to etch the $SiO_2$ layer. The first purge solution 135 and the second purge solution 155 may include a wide variety of non-aqueous organic solvents, including but not limited to, alcohols, ethers, ketones, halocarbons, heterocyclic or other polar organic solvents. Non-exclusive examples of non-aqueous solvents that may be included within the first and the second purge solutions include methanol, isopropyl alcohol, ethanol, dimethyl sulfoxide, acetonitrile, ethyl acetate, acetone, furans, dimethylformamide, isopropanol and dioxane. The first purge solution 135 and the second purge solution 155 should have some solubility with water to effectively remove, and be removed by, the dissolution solution 145. However, the first purge solution 135 and the second purge solution 155 must be anhydrous (absent of water) to prevent continuous etching of the $SiO_2$ layer, ensure self-limiting behavior and prevent loss of selectivity to silicon (Si). In some embodiments, the first purge solution 135 and the second purge solution 155 may include an alcohol, such as methanol ($CH_3OH$) or isopropyl alcohol (IPA, $C_3H_8O$).

The wet ALE process shown in FIG. 1 for etching silicon dioxide ($SiO_2$) can be accomplished using a variety of techniques. For example, the wet ALE process disclosed above may be performed by dipping a $SiO_2$ sample in beakers of each etch solution. In this case, purging can be accomplished by either rinsing or dipping the sample in an appropriate solvent bath. The wet ALE process described above can also be accomplished on a spinner. For example, the $SiO_2$ sample may be rotated while the various solutions are dispensed from a nozzle positioned above the sample. The rotational motion of the sample distributes the solution over the surface. After the set exposure time, the nozzle begins dispensing the next solution in the etch recipe. This process continues through the whole etch cycle and repeats for as many cycles as necessary to remove the desired amount of $SiO_2$ material. For high volume manufacturing, dispensing of etch solutions and rinses can be executed using conventional tools, such as wet etching tools and rinse tools.

Etching experiments were conducted to evaluate etching characteristics of the wet ALE chemistries disclosed herein for etching $SiO_2$ in a wet ALE process. The etching experiments were performed at a benchtop scale using sample coupons cut from 300 mm wafers with 100 nm of wet thermal $SiO_2$ grown on top. During the etching experiments, the sample coupons were dipped into beakers containing the various surface modification, dissolution and purge solutions and left for the allotted soak times. The wet ALE steps were repeated for a number of ALE cycles to perform a cyclic process. The beakers were heated to various process temperatures using a water bath. The thickness of the $SiO_2$ was then measured using ellipsometry to determine the etch amount (expressed in nm) and the etch rate (expressed in nm/cycle or nm/min) achieved during the cyclic process.

The graph 200 shown in FIG. 2 illustrates etch results obtained from a wet ALE process experiment, which used various wet etch chemistries and temperatures to etch a $SiO_2$ surface exposed on the sample coupons. Three etching experiments were performed using different surface modification solutions: (a) a 25% TMAH in methanol solution heated to 65° C., (b) a 25% TMAH in methanol solution heated to 40° C., and (c) a 10% KOH in IPA solution heated to 40° C. The sample coupons were dipped in the surface modification solutions for various soak times (e.g., 0 to 10 minutes) to form a silicate passivation layer on the $SiO_2$ surface. Each surface modification step was then followed by a 30 second dip in an alcohol purge solution (e.g., methanol or IPA), a 30 second dip in DI water to dissolve the silicate passivation layer, and another 30 second dip in the alcohol purge solution (e.g., methanol or IPA). In the etch experiments shown in FIG. 2, the dissolution solution (DI water) was heated to the same temperature (e.g., 40° C. or 65° C.) as the surface modification solution.

After performing the etch experiments, the amount of $SiO_2$ etched from the sample coupons was measured at five points with an ellipsometer and the etch amount (expressed in nm) obtained with each surface modification solution was plotted in graph 200 for the various soak times. The etch amount ranged between 0 nm and 0.9 nm. If the Si—Si spacing in the thermally grown $SiO_2$ is estimated at 0.4 nm, any etch amounts less than 0.4 nm can be interpreted as a partial removal of the $SiO_2$ layers, since the values used for the etch calculations are ultimately based on averages of the thickness measurements.

As shown in the graph 200, the 10% KOH in IPA experiment performed at 40° C. exhibited a slow, but continuous etch of the $SiO_2$ surface, which is unfortunately not self-limiting. However, the data from the 25% TMAH in methanol experiment appears to have promising self-limiting behavior at the same temperature of 40° C. When the temperature of the TMAH solution was increased to 65° C., the etch rate increased significantly, but the change in slope suggests that the surface modification reaction is quasi-self-limiting, rather than strictly self-limiting. As used herein, a "self-limiting" reaction is one in which the rate of reaction goes to zero over time. Thus, a self-limiting surface modification reaction causes only a limited thickness of the $SiO_2$ surface to be modified, regardless of how long a surface modification solution is in contact with the $SiO_2$ surface. In comparison to a strictly self-limiting reaction, a "quasi-limiting" reaction is one in which the rate of reaction decreases over time but does not go to zero.

In some embodiments, the 25% TMAH in methanol solution may be a preferred surface modification solution 115, due to its ability to provide self-limiting silicate formation (e.g., at 40° C.). Other benefits include providing metal-free chemistry with an existing commercially available stock solution. Although preferred in some embodiments, the surface modification solution 115 is not strictly limited to 25% TMAH in methanol, and may include other suitable concentrations of TMAH. For example, the base used in the surface modification solution 115 can be changed from TMAH to another hydroxide, such as KOH, NaOH, or $NH_4OH$. Other alkali metal hydroxides and non-metal hydroxides not specifically listed herein may also be used. Additionally, carbonate salts that react with a $SiO_2$ surface to form silicates can be used as an alternative to hydroxides in the surface modification step 100. Examples of suitable carbonate salts include, but are not limited to, $Na_2CO_3$, $K_2CO_3$ and $(NH_4)_2CO_3$. When selecting a particular combination of base and solvent, consideration must be given to ensure compatibility for this process. For example, it is important to ensure that the base does not react with the solvent before selecting a particular base and solvent combination for use in the wet ALE process described herein.

The graph 300 shown in FIG. 3 illustrates cyclic etch rates obtained from a wet ALE process experiment, which varied the concentration of methanol and IPA in a surface modification solution containing 10% KOH. As shown in the graph 300, the etching experiments performed using 10% KOH dissolved in methanol (no IPA) showed no etching, indicating that the combination of KOH and methanol was not compatible. KOH can participate in a parasitic reaction with methanol to create potassium methoxide ($CH_3KO$), which may have prevented potassium ions ($K^+$) from reacting with the $SiO_2$ surface to form the silicate layer necessary for etching. The graph 300 further shows that the etch rate per cycle remained very low (e.g., about 0.06-0.13 nm/cycle) even when replacing some volume of the methanol with IPA. The fastest etch rate per cycle (e.g., about 0.26 nm/cycle) was achieved when using 10% KOH dissolved in IPA (no methanol).

The graph 400 shown in FIG. 4 illustrates cumulative etch amounts achieved in wet ALE etch experiments using various surface modification solutions and soak times followed by a 30 second soak in deionized (DI) water. Four etching experiments were performed: (a) a 30 second soak in a 10% KOH in IPA solution heated to 40° C., (b) a 30 second soak in a 25% TMAH in methanol solution heated to 65° C., (c) a 2 minute soak in a 25% TMAH in methanol solution heated to 65° C., and (d) a 2 minute soak in a 25% TMAH in methanol solution heated to 65° C. Each surface modification step was then followed by a 30 second dip in an alcohol purge solution (e.g., methanol or IPA), a 30 second dip in DI water to dissolve the silicate passivation layer, and another 30 second dip in the alcohol purge solution (e.g., methanol or IPA). In the etch experiments shown in FIG. 4, the dissolution solution (DI water) was heated to the same temperature (e.g., 40° C. or 65° C.) as the surface modification solution.

As shown in the graph 400, the kinetics for the silicate formation in the 25% TMAH in methanol solution are much slower than in the 10% KOH in IPA solution. A soak time of five minutes in TMAH is required to match the cyclic etch rate of 30 seconds in KOH and results in a much slower etch rate per cycle and overall etch rate per minute as can be seen in the graphs 500 and 510 shown in FIGS. 5A and 5B. This characteristic is further amplified by the lower etch temperature for the KOH experiments at 40° C. vs the TMAH experiments performed at 65° C. After etching the SiO$_2$ surface using the 25% TMAH in methanol solution at 65° C., samples were sent for analysis by x-ray photoelectron spectroscopy. Some of the spectra received are shown in FIGS. 6A-6B, specifically highlighting the Si2p and N1s peaks.

The graphs 600 and 610 shown in FIGS. 6A-6B illustrate x-ray photoelectron spectroscopy (XPS) data obtained from a wet ALE process experiment, which used a 25% TMAH in methanol surface modification solution at 65° C. followed by a 30 second soak in deionized (DI) water to etch the SiO$_2$ surface. As in the previous experiments, purge steps were performed before and after the surface modification and dissolution steps to prevent mixing of the surface modification and dissolution solutions. The graph 600 illustrates the spectra for the silicon (Si) 2p peak in FIG. 6A, while the graph 610 illustrates the spectra for the nitrogen (N) 1s peak in FIG. 6B. As shown in FIG. 6A, the spectra for the Si2p peak exhibits a shift towards lower binding energies which can be attributed to an increase in silicate type bonding of the Si atoms during the TMAH treatment. The spectra in FIG. 6B shows the presence of nitrogen on the sample surface, which is indicative of the tetramethylammonium ion in the surface silicate, since this specific binding energy can be attributed to quaternary nitrogen bonds. This data confirms that the tetramethylammonium ion is binding to the silica surface and creating a silicate which increases in thickness over the two soak times (1 minute and 10 minutes) measured.

ALE processes generally produce decreases in surface roughness due to geometric affects resulting in a smoothing of surface features. The graph 700 shown in FIG. 7 shows the effect of TMAH soak time on root mean square (RMS) roughness as measured from atomic force microscopy (AFM) analysis. The data shown in FIG. 7 was obtained from wet ALE process experiments, which used a 25% TMAH in methanol surface modification solution at 65° C. followed by a 30 second soak in deionized (DI) water to etch the SiO$_2$ surface. As in the previous experiments, purge steps were performed before and after the surface modification and dissolution steps to prevent mixing of the surface modification and dissolution solutions. In the graph 700, the RMS roughness of the SiO$_2$ surface is plotted against various surface modification solution soak times ranging between 0 and 2 minutes. The RMS data demonstrates that the wet ALE process described herein can maintain or decrease surface roughness of a SiO$_2$ surface.

Based on the wet ALE process experiments described, one embodiment of a preferred wet ALE process for etching a SiO$_2$ layer may include multiple ALE cycles, where each ALE cycle includes: (a) a 2-5 minute soak in a 25% TMAH in methanol solution heated to a temperature ranging between about 40-65° C. to form a silicate passivation layer, (b) a 30 second dip in an alcohol purge solution (e.g., methanol or IPA), (c) a 30 second dip in DI water to dissolve the silicate passivation layer, and another 30 second dip in the alcohol purge solution (e.g., methanol or IPA). The dissolution solution (DI water) may be heated to the same temperature as the surface modification solution (TMAH in methanol).

New etch chemistries are described above for etching SiO$_2$ in a wet ALE process. As noted above, the new etch chemistries disclosed herein use an anhydrous basic surface modification solution to create self-limiting reactions on exposed surfaces of the SiO$_2$ layer and form a silicate passivation layer, which is insoluble in the surface modification solution, but readily soluble in the dissolution solution. Unlike conventional processes used to etch SiO$_2$, the wet ALE process disclosed herein provides a new process for etching SiO$_2$ with a unique wet etch chemistry that is both self-limiting and selective to other silicon-containing compounds, such as silicon (Si) and silicon nitride (Si$_3$N$_4$). In some embodiments, the wet etch chemistry may use metal-free chemistry with standard commercially available solutions (such as, e.g., TMAH) to avoid metal contamination on the SiO$_2$ surface. In addition to providing a self-limiting, selective etch, the wet ALE process and wet etch chemistries disclosed herein improve etch uniformity, provide greater control over the etch amount, and leave the post-etched SiO$_2$ surface smoother than the incoming surface.

The SiO$_2$ wet ALE process described herein may be performed within a variety of semiconductor processing systems. For example, the SiO$_2$ wet ALE process described herein may be performed by dispensing the various etch solutions onto a substrate disposed within a spin chamber, or sequentially dipping the substrate to be etched in tanks comprising the various etch solutions. When a spin chamber is utilized, etch solutions are dispensed from a nozzle positioned over the substrate and are distributed by the rotational motion of a spin chuck on which the substrate is disposed. The only important consideration in implementing the wet ALE process described herein is the temporal separation of chemical exposures: i.e., the surface modification solution and the dissolution solution must be kept separate and prevented from mixing on the substrate surface. Any mixing of these two solutions can lead to a continuous etch process and an increase in surface roughness.

FIG. 8 illustrates one embodiment of a processing system 800 that may use the techniques described herein to etch a SiO$_2$ material exposed on a surface of a substrate 830. As shown in FIG. 8, the processing system 800 includes a process chamber 810, which in some embodiments, may be a pressure controlled chamber. In the embodiment shown in FIG. 8, the process chamber 810 is a spin chamber having a spin chuck 820, which is configured to spin or rotate at a rotational speed. A substrate 830 is held on the spin chuck

820, for example, via electrostatic force or vacuum pressure. In one example, the substrate 830 may be a semiconductor wafer having a SiO₂ material formed on or within the substrate 830.

The processing system 800 shown in FIG. 8 further includes a liquid nozzle 840, which is positioned over the substrate 830 for dispensing various etch solutions 842 onto a surface of the substrate 830. The etch solutions 842 dispensed onto the surface of the substrate 830 may generally include a surface modification solution to chemically modify the SiO₂ surface and form a modified surface layer (e.g., a silicate passivation layer), and a dissolution solution to selectively remove the modified surface layer from the SiO₂ surface. Purge solutions may also be dispensed onto the surface of the substrate 830 between surface modification and dissolution steps to separate the surface modification and dissolution solutions. Examples of surface modification, dissolution and purge solutions are discussed above.

As shown in FIG. 8, the etch solutions 842 may be stored within a chemical supply system 846, which may include one or more reservoirs for holding the various etch solutions 842 and a chemical injection manifold, which is fluidly coupled to the process chamber 810 via a liquid supply line 844. In operation, the chemical supply system 846 may selectively apply desired chemicals to the process chamber 810 via the liquid supply line 844 and the liquid nozzle 840 positioned within the process chamber 810. Thus, the chemical supply system 846 can be used to dispense the etch solutions 842 onto the surface of the substrate 830. The process chamber 810 may further include a drain 850 for removing the etch solutions 842 from the process chamber 810.

Components of the processing system 800 can be coupled to, and controlled by, a controller 860, which in turn, can be coupled to a corresponding memory storage unit and user interface (not shown). Various processing operations can be executed via the user interface, and various processing recipes and operations can be stored in the memory storage unit. Accordingly, a given substrate 830 can be processed within the process chamber 810 in accordance with a particular recipe. In some embodiments, a given substrate 830 can be processed within the process chamber 810 in accordance with an etch recipe that utilizes the wet ALE techniques described herein for etching a SiO₂ surface.

The controller 860 shown in block diagram form in FIG. 8 can be implemented in a wide variety of manners. In one example, the controller 860 may be a computer. In another example, the controller 860 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD), field programmable gate array (FPGA), etc.), and/or other programmable integrated circuits can be programmed with software or other programming instructions to implement the functionality of a prescribed process recipe. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits can cause the programmable integrated circuits to perform the processes, functions, and/or capabilities described herein. Other variations could also be implemented.

As shown in FIG. 8, the controller 860 may be coupled to various components of the processing system 800 to receive inputs from, and provide outputs to, the components. For example, the controller 860 may be coupled to: the process chamber 810 for controlling the temperature and/or pressure within the process chamber 810; the spin chuck 820 for controlling the rotational speed of the spin chuck 820; and the chemical supply system 846 for controlling the various etch solutions 842 dispensed onto the substrate 830. The controller 860 may control other processing system components not shown in FIG. 8, as is known in the art.

In some embodiments, the controller 860 may control the various components of the processing system 800 in accordance with an etch recipe that utilizes the wet ALE techniques described herein for etching a SiO₂ layer. For example, the controller 860 may supply various control signals to the chemical supply system 846, which cause the chemical supply system 846 to: a) dispense a surface modification solution onto the surface of the substrate 830 to chemically modify exposed surfaces of the SiO₂ layer and create a modified surface layer (e.g., a silicate passivation layer) on the substrate 830; b) rinse the substrate 830 with a first purge solution to remove excess reactants from the surface; c) dispense a dissolution solution onto the surface of the substrate 830 to selectively remove or dissolve the modified surface layer; and d) rinse the substrate with a second purge solution to remove the dissolution solution from the surface of the substrate 830. In some embodiments, the controller 860 may supply the control signals to the chemical supply system 846 in a cyclic manner, such that the steps a)-d) are repeated for one or more ALE cycles, until a desired amount of the SiO₂ layer has been removed.

The controller 860 may also supply control signals to other processing system components. In some embodiments, for example, the controller 860 may supply control signals to the spin chuck 820 and/or the chemical supply system 846 to dry the substrate 830 after the second purge step is performed. In one example, the controller 860 may control the rotational speed of the spin chuck 820, so as to dry the substrate 830 in a spin dry step. In another example, control signals supplied from the controller 860 to the chemical supply system 846 may cause a drying agent (such as, e.g., isopropyl alcohol) to be dispensed onto the surface of the substrate 830 to further assist in drying the substrate before performing the spin dry step.

In some embodiments, the controller 860 may control the temperature and/or the pressure within the process chamber 810. In some embodiments, the surface modification, dissolution and purge steps of the wet ALE process described herein may be performed at roughly the same temperature and pressure. In one example implementation, the surface modification, dissolution and purge steps may each be performed at (or near) atmospheric pressure and a temperature ranging, e.g., between approximately 40-65° C. Performing the processing steps within the same process chamber at roughly the same temperature and pressure decreases the cycle time and improves the throughput of the wet ALE process described herein by avoiding unnecessary chamber transitions and temperature/pressure changes.

FIGS. 9-10 illustrate exemplary methods that utilize the techniques described herein for etching a SiO₂ layer in a wet ALE process. It will be recognized that the embodiments of FIGS. 9-10 are merely exemplary and additional methods may utilize the techniques described herein. Further, additional processing steps may be added to the methods shown in the FIGS. 9-10 as the steps described are not intended to be exclusive. Moreover, the order of the steps is not limited to the order shown in the figures as different orders may occur and/or various steps may be performed in combination or at the same time.

FIG. 9 illustrates one embodiment of a method 900 of etching a silicon dioxide ($SiO_2$) layer. The method 900 shown in FIG. 9 may generally include receiving a substrate having a silicon dioxide ($SiO_2$) layer formed thereon, wherein a surface of the $SiO_2$ layer is exposed on a surface of the substrate (in step 910), and exposing the surface of the substrate to a surface modification solution comprising base dissolved in a non-aqueous solvent (in step 920). When exposed to the surface modification solution in step 920, the base reacts with the surface of the $SiO_2$ layer to form a silicate passivation layer, which is self-limited and insoluble in the surface modification solution. Next, the method 900 may include removing the surface modification solution from the surface of the substrate subsequent to forming the silicate passivation layer (in step 930) and exposing the surface of the substrate to a dissolution solution that selectively dissolves the silicate passivation layer (in step 940). Next, the method 900 may include removing the dissolution solution from the substrate to etch the $SiO_2$ layer (in step 950).

In some embodiments, the method 900 may further include repeating the steps of exposing the surface of the substrate to the surface modification solution (in step 920), removing the surface modification solution (in step 930), exposing the surface of the substrate to the dissolution solution (in step 940), and removing the dissolution solution (in step 950) a number of cycles until a predetermined amount of the $SiO_2$ layer is removed from the substrate.

FIG. 10 illustrates one embodiment of a method 1000 that may be used for etching a silicon dioxide ($SiO_2$) layer using a wet atomic layer etching (ALE) process. The method 1000 shown in FIG. 10 may generally include: a) receiving a substrate, the substrate having the silicon dioxide ($SiO_2$) layer formed thereon (in step 1010); b) exposing the $SiO_2$ layer to a surface modification solution containing a base dissolved in a non-aqueous solvent, wherein the base reacts with an exposed surface of the $SiO_2$ layer to form a modified surface layer containing a silicate (in step 1020); c) rinsing the substrate with a first purge solution to remove the surface modification solution from a surface of the substrate (in step 1030); d) exposing the modified surface layer to a dissolution solution to dissolve the modified surface layer and uncover an unmodified surface of the $SiO_2$ layer underlying the modified surface layer (in step 1040); c) rinsing the substrate with a second purge solution to remove the dissolution solution from the surface of the substrate (in step 1050); and f) repeating steps b)-e) for one or more cycles until a predetermined amount of the $SiO_2$ layer is removed from the substrate (in step 1060).

A variety of different etch chemistries may be used in the surface modification and dissolution solutions used in the method embodiments shown in FIGS. 9 and 10. As noted above, the surface modification solution may generally include a base dissolved in a non-aqueous solvent. The base may include a hydroxide or a carbonate salt, as described above in reference to FIG. 1. The non-aqueous solvent may be an alcohol, an ether, a ketone, a halocarbon, a heterocyclic or another polar organic solvent. More specific examples of bases and non-aqueous solvents are provided above. The dissolution solution may generally include an aqueous solvent (e.g., deionized water) or a non-aqueous solvent. Examples of non-aqueous solvents that may be included within the dissolution solution include, but are not limited to, alkylene glycols such as ethylene glycol.

The present disclosure provides systems and methods that utilize new etch chemistries in a wet ALE process for etching a $SiO_2$ material exposed on a surface of a substrate. The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching a silicon dioxide ($SiO_2$) layer, the method comprising:

receiving a substrate having the silicon dioxide ($SiO_2$) layer formed thereon, wherein a surface of the silicon dioxide ($SiO_2$) layer is exposed on a surface of the substrate;

exposing the surface of the substrate to a surface modification solution comprising a base dissolved in a non-aqueous solvent, wherein the base reacts with the surface of the silicon dioxide ($SiO_2$) layer to form a silicate passivation layer, which is self-limited and insoluble in the surface modification solution;

removing the surface modification solution from the surface of the substrate subsequent to forming the silicate passivation layer;

exposing the surface of the substrate to a dissolution solution that selectively dissolves the silicate passivation layer; and removing the dissolution solution from the substrate to etch the silicon dioxide ($SiO_2$) layer.

2. The method of claim 1, further comprising repeating said exposing the surface of the substrate to the surface modification solution, removing the surface modification solution, exposing the surface of the substrate to the dissolution solution, and removing the dissolution solution a number of cycles until an amount of the silicon dioxide ($SiO_2$) layer is removed from the substrate.

3. The method of claim 1, wherein the base included within the surface modification solution is a hydroxide or a carbonate salt.

4. The method of claim 3, wherein the base included within the surface modification solution is sodium hydroxide (NaOH), potassium hydroxide (KOH), magnesium hydroxide ($Mg(OH)_2$), calcium hydroxide ($Ca(OH)_2$), ammonium hydroxide ($NH_4OH$), tetramethylammonium hydroxide (TMAH, $N(CH_3)_4OH$), tetrabutylammonium hydroxide ($C_{16}H_{37}NO$) or choline hydroxide ($[(CH_3)_3NCH_2CH_2OH]^+OH^-$).

5. The method of claim 3, wherein the base is sodium carbonate ($Na_2CO_3$), potassium carbonate ($K_2CO_3$), magnesium carbonate ($MgCO_3$), calcium carbonate ($CaCO_3$), ammonium carbonate (($NH_4)_2CO_3$), tetramethylammonium carbonate (($N(CH_3)_4CO_3$), tetrabutylammonium carbonate ($C_{33}H_{72}N_2O_3$), or choline carbonate ($C_6H_{14}NO_3^+$).

6. The method of claim 3, wherein the base included within the surface modification solution is a hydroxide having $R^+$ cations and $OH^-$ anions, wherein the $R^+$ cations and the $OH^-$ anions in the surface modification solution react with the surface of the silicon dioxide ($SiO_2$) layer to form the silicate passivation layer in a self-limiting reaction, the silicate passivation layer having a chemical formula of $R_{2x}Si_yO_{2y+x}$, where a ratio of x:y ranges between 0.25 and 2.

7. The method of claim 6, wherein the $R^+$ cations comprise alkali metal cations, alkali earth metal cations, ammonium cations or quaternary ammonium cations.

8. The method of claim 3, wherein the base included within the surface modification solution is a carbonate salt having $R''^+$ cations and $CO_3^{2-}$ anions, wherein the $R''^+$ cations and the $CO_3^{2-}$ anions in the surface modification solution react with the surface of the silicon dioxide ($SiO_2$) layer to form the silicate passivation layer in a self-limiting reaction, the silicate passivation layer having a chemical formula of $R_{2x}Si_yO_{2y+x}$, where a ratio of x:y ranges between 0.25 and 2.

9. The method of claim 8, wherein the $R''^+$ cations comprise alkali metal cations, alkali earth metal cations, ammonium cations or quaternary ammonium cations.

10. The method of claim 1, wherein the non-aqueous solvent included within the surface modification solution comprises an alcohol, an ether, a ketone, a halocarbon, a heterocyclic or another polar organic solvent.

11. The method of claim 1, wherein the non-aqueous solvent included within the surface modification solution comprises methanol, isopropyl alcohol, ethanol, dimethyl sulfoxide, acetonitrile, ethyl acetate, acetone, furans, dimethylformamide, or dioxane.

12. The method of claim 1, wherein the dissolution solution comprises an aqueous solvent, and wherein when exposed to the aqueous solvent, the silicate passivation layer is dissolved by the aqueous solvent.

13. The method of claim 1, wherein the dissolution solution comprises a non-aqueous solvent, and wherein when exposed to the non-aqueous solvent, the silicate passivation layer is dissolved by the non-aqueous solvent.

14. The method of claim 13, wherein the non-aqueous solvent included within the dissolution solution comprises ethylene glycol or glycerol.

15. A method of etching a silicon dioxide ($SiO_2$) layer using a wet atomic layer etching (ALE) process, the method comprising:

a) receiving a substrate, the substrate having the silicon dioxide ($SiO_2$) layer formed thereon;

b) exposing the silicon dioxide ($SiO_2$) layer to a surface modification solution containing a base dissolved in a non-aqueous solvent, wherein the base reacts with an exposed surface of the silicon dioxide ($SiO_2$) layer to form a modified surface layer containing a silicate;

c) rinsing the substrate with a first purge solution to remove the surface modification solution from a surface of the substrate;

d) exposing the modified surface layer to a dissolution solution to dissolve the modified surface layer and uncover an unmodified surface of the silicon dioxide ($SiO_2$) layer underlying the modified surface layer;

e) rinsing the substrate with a second purge solution to remove the dissolution solution from the surface of the substrate; and f) repeating steps b)-e) for one or more cycles until an amount of the silicon dioxide ($SiO_2$) layer is removed from the substrate.

16. The method of claim 15, wherein the base included within the surface modification solution is a hydroxide or a carbonate salt.

17. The method of claim 15, wherein the base included within the surface modification solution is a hydroxide having $R^+$ cations and OH-anions, wherein the $R^+$ cations and the OH anions in the surface modification solution react with the exposed surface of the silicon dioxide ($SiO_2$) layer to form a silicate passivation layer in a self-limiting reaction, the silicate passivation layer having a chemical formula of $R_{2x}Si_yO_{2y+x}$, where a ratio of x:y ranges between 0.25 and 2.

18. The method of claim 15, wherein the base included within the surface modification solution is sodium hydroxide (NaOH), potassium hydroxide (KOH), magnesium hydroxide ($Mg(OH)_2$), calcium hydroxide ($Ca(OH)_2$), ammonium hydroxide ($NH_4OH$), tetramethylammonium hydroxide (TMAH, $N(CH_3)_4OH$), tetrabutylammonium hydroxide ($C_{16}H_{37}NO$) or choline hydroxide ($[(CH_3)_3NCH_2CH_2OH]^+OH^-$).

19. The method of claim 15, wherein the base included within the surface modification solution is a carbonate salt having $R^+$ cations $CO_3^{2-}$ anions, wherein the $R^+$ cations and the $CO_3^{2-}$ anions in the surface modification solution react with the exposed surface of the silicon dioxide ($SiO_2$) layer to form a silicate passivation layer in a self-limiting reaction, the silicate passivation layer having a chemical formula of $R_{2x}Si_yO_{2y+x}$, where a ratio of x:y ranges between 0.25 and 2.

20. The method of claim 15, wherein the base included within the surface modification solution is sodium carbonate ($Na_2CO_3$), potassium carbonate ($K_2CO_3$), magnesium carbonate ($MgCO_3$), calcium carbonate ($CaCO_3$), ammonium carbonate ($(NH_4)_2CO_3$), tetramethylammonium carbonate ($(N(CH_3)_4CO_3)$), tetrabutylammonium carbonate ($C_{33}H_{72}N_2O_3$), or choline carbonate ($C_6H_{14}NO_3^+$).

21. The method of claim 15, wherein the dissolution solution comprises an aqueous solvent or a non-aqueous solvent in which the silicate is soluble.

22. The method of claim 15, wherein the first purge solution and the second purge solution each comprise a non-aqueous organic solvent.

* * * * *